(12) United States Patent
Quah et al.

(10) Patent No.: US 6,852,574 B1
(45) Date of Patent: Feb. 8, 2005

(54) METHOD OF FORMING A LEADFRAME FOR A SEMICONDUCTOR PACKAGE

(75) Inventors: Guan Keng Quah, Gilbert, AZ (US); Darrell D. Truhitte, Phoenix, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 0 days.

(21) Appl. No.: 10/638,181

(22) Filed: Aug. 11, 2003

(51) Int. Cl.[7] .......................... H01I 21/44; H01I 21/48; H01L 21/50
(52) U.S. Cl. ........................................ 438/123; 438/456
(58) Field of Search ................................ 438/123, 124, 438/125, 126, 127, 106, 455, 456

(56) References Cited

U.S. PATENT DOCUMENTS

| | | | | |
|---|---|---|---|---|
| 5,059,379 A | * | 10/1991 | Tsutsumi et al. | 264/272.14 |
| 6,116,963 A | * | 9/2000 | Shutter | 439/676 |
| 6,518,652 B2 | * | 2/2003 | Takata et al. | 257/676 |
| 6,769,936 B2 | * | 8/2004 | Gutierrez et al. | 439/676 |

* cited by examiner

Primary Examiner—David Nhu
(74) Attorney, Agent, or Firm—Robert F. Hightower (57) ABSTRACT

A method of forming a leadframe (10) provides blocking fulcrums (21,23) adjacent to the leads (12,13,14, and 15). During the process of encapsulating the leadframe (10), the blocking fulcrums (21,23) restrict encapsulating material from exiting the mold cavity and from attaching to the leads (12,13,14, and 15).

13 Claims, 7 Drawing Sheets

METHOD OF FORMING A LEADFRAME FOR A SEMICONDUCTOR PACKAGE

BACKGROUND OF THE INVENTION

The present invention relates, in general, to packaging, and more particularly, to methods of forming leadframes and semiconductor packages.

In the past, various methods were utilized to manufacture both semiconductor packages and the leadframes utilized in manufacturing the semiconductor packages. One leadframe manufacturing method produced a leadframe having a dam-bar that extended laterally between the leads and that was connected to each lead of the leadframe. When the leadframe was molded into a package, the dam-bar was intended to prevent the molding compound from reaching the package leads. The dam-bar had to be positioned sufficiently far from the package body to leave room to excise the dam-bar without damaging the package body. The large space between the package body and the dam-bar allowed the mold material to escape and fill the space. The material also attached to the side of the leads.

Another method produced a leadframe that did not have a dam-bar. The molding equipment or mold that was utilized to produce the semiconductor package had channels or recesses into which the leads were placed. During the molding operation, mold material often traveled through the channels and attached to the sides of the leads. This mold material often is referred to as flash or flashing.

The flashing that resulted from these processes had to be removed from the leads after the molding operations were complete. In some cases, the flashing was along the entire length of the lead and could be up to 0.15 milli-meters thick. Flash removal procedures included using a high-pressure jet of water or of particles or a chemical jet to remove the flashing. The pressure often was in the range of about two hundred fifty to four hundred twenty five Kilo-grams/square centi-meter (250–425 KGm/cm$^2$).

As the size of semiconductor packages and leads for the packages continued to decrease, the leads and the packages became more delicate and more easily damaged. The smaller lead and package sizes made it more difficult to prevent the mold material from escaping the mold cavities, thus, made it more difficult to keep the mold material from adhering to the leads. In some cases the flashing was longer than the finished lead length and could be thicker than the lead width. This made flashing removal very difficult. Additionally, the smaller lead and package size made it more difficult to remove the flashing without damaging the leads and the packages.

Accordingly, it is desirable to have a leadframe having small leads, that reduces the amount of mold material escaping from the mold cavity and along the leads, that reduces the amount of mold material or flashing adhering to the leads, and that minimizes lead damage during flashing removal.

BRIEF DESCRIPTION OF THE DRAWINGS

For simplicity and clarity of illustration, elements in the figures are not necessarily to scale, and the same reference numbers in different figures denote the same elements. Additionally, descriptions and details of well known steps and elements are omitted for simplicity of the description.

DETAILED DESCRIPTION OF THE DRAWINGS

Figure 1:
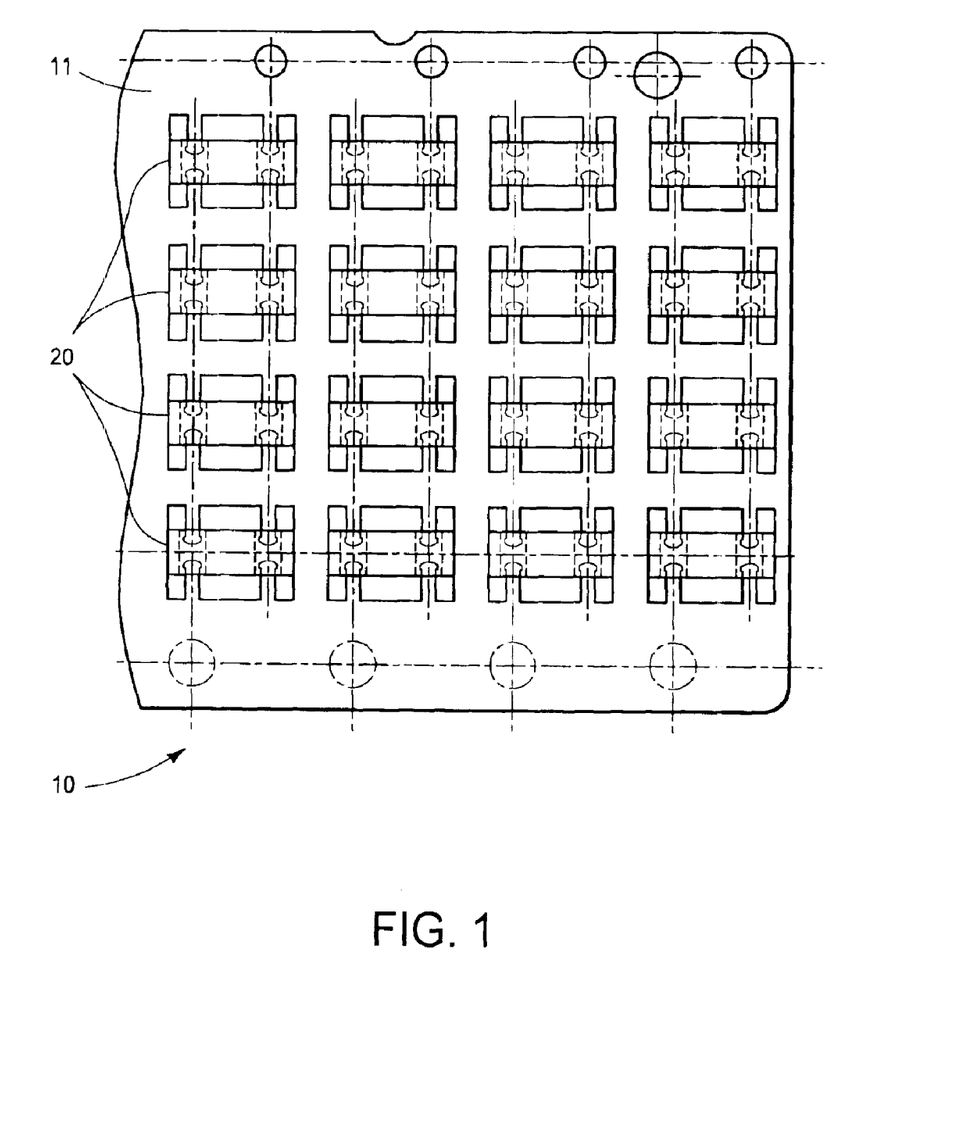
FIG. 1 illustrates an enlarged plan view of a portion of an embodiment of a leadframe in accordance with the present invention.

FIG. 1 illustrates an enlarged plan view of a portion of an embodiment of a leadframe strip or leadframe 10. Leadframe 10 typically is produced as a strip that has a plurality of package sites 20 at which semiconductor packages are to be formed. Leadframe 10 includes a main panel section or main panel 11 that supports all the other elements of leadframe 10 during the manufacturing process. As is well known in the art, main panel 11 typically is a long thin sheet of metal from which the other elements of leadframe 10 are produced.

Figure 2:
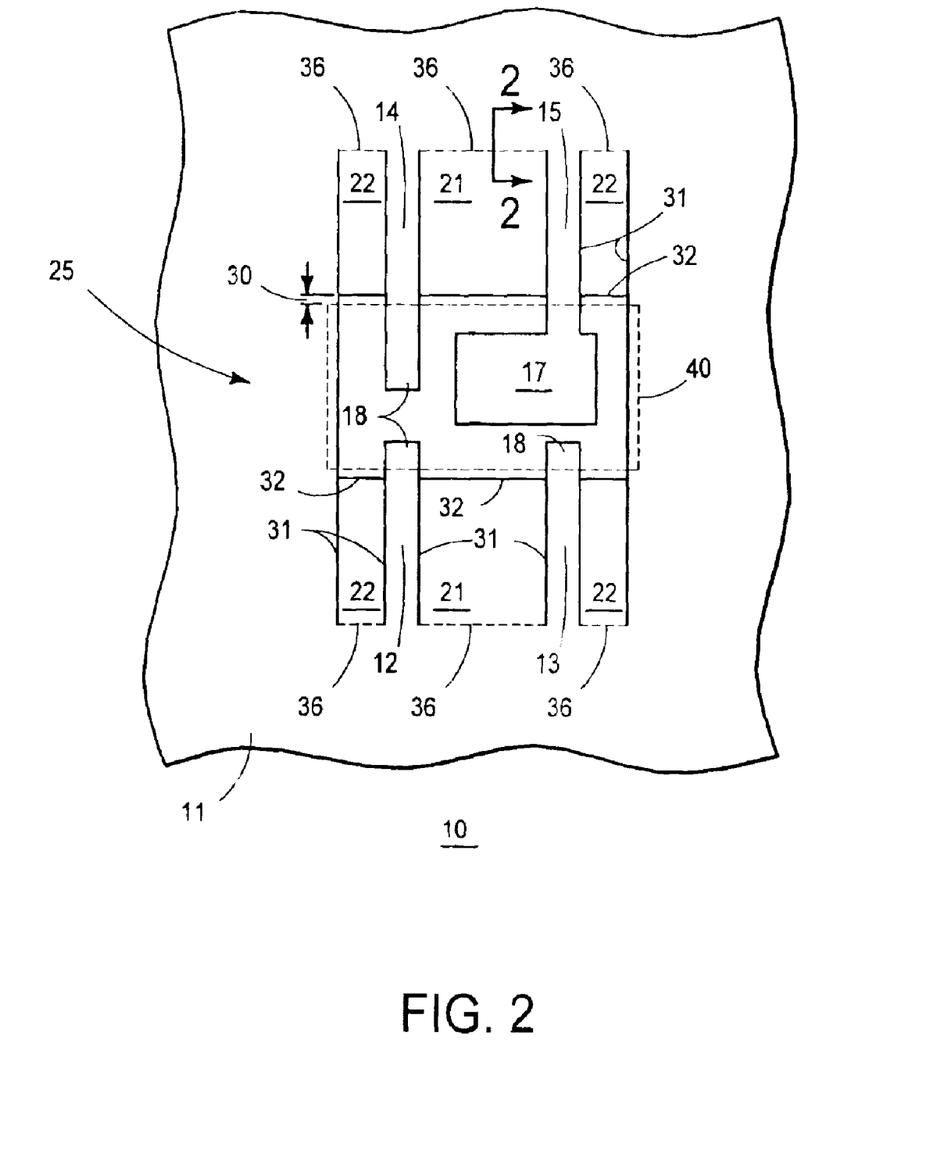
FIG. 2 illustrates an enlarged plan view of an embodiment of a portion of the leadframe of FIG. 1 in accordance with the present invention.

FIG. 2 illustrates a further enlarged plan view of leadframe 10 of FIG. 1 illustrating an embodiment of a portion of one package site 25 of the plurality of package sites 20 shown in FIG. 1. This explanation has references to both FIG. 1 and FIG. 2. Site 25, and typically each site 20, includes a cavity section 40 which is intended to be encapsulated during the process of forming a semiconductor package from leadframe 10. Cavity section 40 is illustrated in general by a dashed box. Site 25, thus sites 20 and leadframe 10, includes a plurality of leads that includes leads 12, 13, 14, and 15 that extend from panel 11 into cavity section 40. Leads 12, 13, 14, and 15 may be referred to hereinafter as the plurality of leads or as leads 12–15. For clarity of the description and drawings, four leads are illustrated, however, those skilled in the art realize various numbers of leads may extend into cavity section 40. A proximal end of each lead 12, 13, 14, and 15 is attached to panel 11, and the sides extend from panel 11 a first distance into cavity section 40. Generally, the sides extend perpendicularly to a near side of section 40. A distal end of each lead 12, 13, 14, and 15 is within cavity section 40. The distal end of lead 15 has a die attach area or flag 17 that is formed for attaching a semiconductor die thereto. A distal end 18 of leads 12, 13, and 14 have a bonding area that will be utilized for attaching bonding wires to the semiconductor die that will be attached to flag 17. Such flags and bonding areas are well known to those skilled in the art.

Site 25, and typically each site 20, of leadframe 10 are also formed to include a plurality of blocking fulcrums that assist in blocking encapsulation material from flowing along the plurality of leads and from attaching to the plurality of leads. The plurality of blocking fulcrums include blocking fulcrums 21 and 22. In general, one of fulcrums 21 or 22 is formed adjacent each side of each lead 12, 13, 14, or 15. Other embodiments may have more than one fulcrum between leads or may have fewer. Although fulcrums 21 and 22 are illustrated with different widths, the width of each blocking fulcrum generally is determined from a number of parameters including the number of leads, lead spacing, and the width of the leads. A proximal end of fulcrums 21 and 22 is attached to panel 11. Fulcrums 21 and 22 have sides 31 that extend from the proximal end toward section 40 and terminate at a distal end 32. Preferably, a distance 30 separates ends 32 from the edge of cavity section 40. However, in some cases, ends 32 may extend a small distance or second distance into section 40. In such a case, ends 32 terminate a shorter distance into section 40 than do the ends of leads 12–15, thus, the first distance of ends 18 is larger than the second distance of ends 32. Distance 30 can be up to about fifty (50) microns and preferably is no greater than about ten (10) microns. For the case where ends 32 extend the second distance into section 40, the second distance generally is no greater than about fifty (50) microns. Sides 31 typically are adjacent to one of leads 12–15 and separated from the adjacent lead by a small spacing 35 (see FIG. 4).

As will be seen subsequently, during the process of encapsulating sites 20 of leadframe 10 fulcrums 21 and 22 substantially prevent the flow of encapsulating compound from escaping and attaching to leads 12–15. After the encapsulation process, fulcrums 21 and 22 will be moved away from the plane of leads 12–15 and leadframe 10. In order to facilitate the movement, leadframe 10 may be formed to include optional relief features 36 that assist in controlling any bending or other movement that occurs at the proximal end of fulcrums 21 and 22. Features 36 are illustrated by dashed lines. Typically, features 36 are indentations that are made in the surface of panel 11. As will be seen hereinafter, during the process of forming a semiconductor package from leadframe 10, features 36 provide a location for fulcrums 21 and 22 to move or to bend. This minimizes the deformation of panel 11 and improves the planarity of leads 12–15 as well as the planarity of panel 11. Features 36 are located at the point that is most desirable for fulcrums 21 and/to bend or otherwise move. Typically, features 36 are located laterally across fulcrums 21 and at the proximal end of the respective fulcrum. Features 36 have a length that is sufficient to control the movement as desired. In the preferred embodiment, features 36 extend approximately across the width of fulcrums 21 and 22, however, in other embodiments features 36 may only extend a portion of the width of fulcrums 21 and 22.

Figure 3:
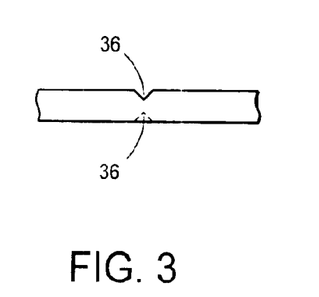
FIG. 3 illustrates a greatly enlarged cross-sectional view of an embodiment of a portion of the leadframe of FIG. 2 in accordance with the present invention.

FIG. 3 illustrates a greatly enlarged cross-sectional view of feature 36 of leadframe 10 along section line 2—2 of FIG. 2. Features 36 can have various depths and shapes, for example a V shape, a U shape, or other shape, that assists controlling the location along panel 11 where bending or other movement of fulcrums 21 and 22 occurs. In the preferred embodiment, features 36 are V shaped. In order to facilitate the controlled movement, the depth of features 36 typically is less than about one-half the thickness of panel 11 and preferably is no greater than about one-fourth. The width of feature 36 at the surface of panel 11 is usually no greater than about four times the depth and preferably is no greater than about two times the depth. Features 36 may be formed on either surface of panel 11 or may be formed on both surfaces as illustrated by the dashed lines in FIG. 3. Features 36 provide some control over the bending or other movement of fulcrums 21 and 22, thus, improve the manufacturing process. However, features 36 are optional and could be omitted in some embodiments.

Figure 4:
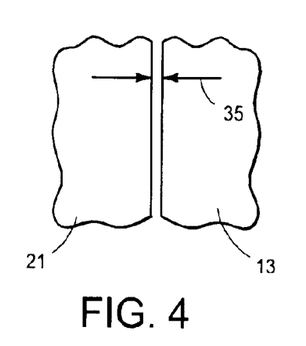
FIG. 4 illustrates a greatly enlarged plan view of an embodiment of another portion of the leadframe of FIG. 2 in accordance with the present invention.

FIG. 4 illustrates a greatly enlarged plan view of spacing 35 of leadframe 10. Spacing 35 is formed sufficiently small to substantially prevent the encapsulating compound of the encapsulating material from traveling along the portion of leads 12–15 that is external to section 40. Those skilled in the art realize that some of the resin used in the encapsulating material may escape but that such is not considered the encapsulating compound part of the encapsulating material. Spacing 35 typically is less than about twenty five (25) microns and preferably is substantially zero.

Referring back to FIG. 1 and FIG. 2, various well-known techniques can be utilized to form leadframe 10. For example, the openings within cavity section 40 can be stamped from a piece of sheet metal using techniques that are well known in the art. This stamping operation could also cut fulcrums 21 and 22 to terminate at end 32 and could form optional features 36. Thereafter, a shearing operation can be employed to cut fulcrums 21 and 22 along sides 31 in order to separate fulcrums 21 and 22 from leads 12–15 and from panel 11. Thus, three sides of each of leads 12–15 become detached from panel 11. In some cases, the shearing operation may bend or displace portions of fulcrums 21 and 22 or portions of leads 12–15 (See FIG. 5). In such cases a realignment operation can be utilized to bend fulcrums 21 and 22 or leads 12–15 back close to alignment such as close to aligning to the plane of panel 11 (See FIG. 6). For example, a light coining or light spanking may be employed to implement the realignment operation. Improving the alignment minimizes space 35 and assists in substantially preventing encapsulating compound from reaching leads 12–15. Alternatively, the stamping operation could also sever fulcrums 21 and 22 from leads 12–15. Those skilled in the art realize that leadframe 10 could also be etched. Additionally, a laser or water jet could be used to form leads 12–15, fulcrums 21 and 22, and features 36.

Figure 5:
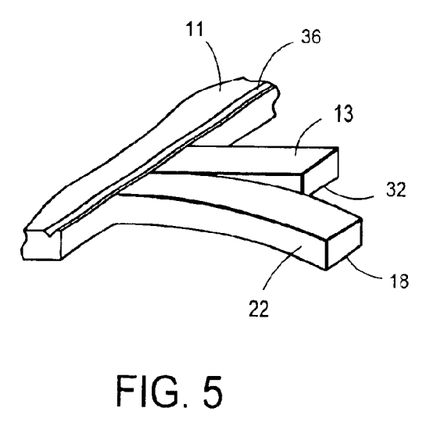
FIG. 5 illustrates a greatly enlarged isometric view of a portion of the leadframe of FIG. 2 at a stage of manufacturing the leadframe in accordance with the present invention.

FIG. 5 illustrates a greatly enlarged isometric view of a portion of leadframe 10 of FIG. 1 at a stage of manufacturing leadframe 10. At the stage illustrated in FIG. 5, fulcrums 21 and were sheared from leads 12–15. In some cases, leads 12–15 or fulcrums 21 and 22 may potentially be slightly misaligned or misshaped. For clarity of the drawing such potential misshape is shown in an exaggerated form.

Figure 6:
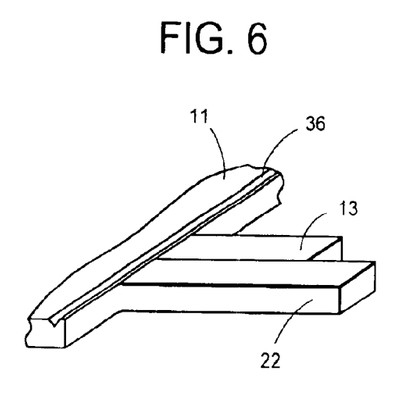
FIG. 6 illustrates a greatly enlarged isometric view of the portion of the leadframe of FIG. 5 at a subsequent stage of manufacturing the leadframe in accordance with the present invention.

FIG. 6 illustrates a greatly enlarged isometric view of the portion of leadframe 10 of FIG. 5 at a subsequent stage of manufacturing after the realignment operation.

Figure 7:
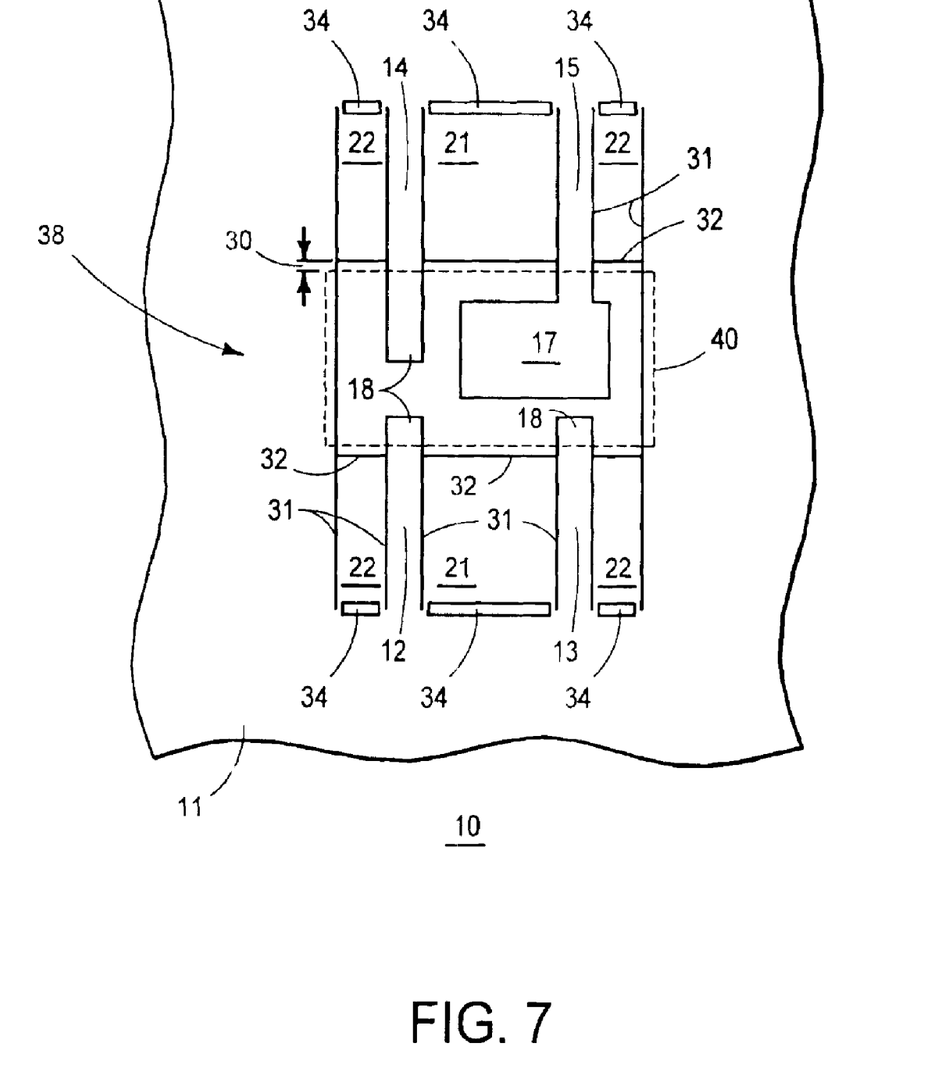
FIG. 7 illustrates an enlarged plan view of a second embodiment of a portion of the leadframe of FIG. 1 in accordance with the present invention.

FIG. 7 illustrates an enlarged plan view of a second embodiment of a portion of leadframe 10 of FIG. 1 illustrating an embodiment of a portion of a package site 38 that is an alternate embodiment of site 25 shown in FIG. 2. This explanation has references to FIG. 1 and FIG. 2. Site 38 includes an optional relief port 34 that provides some control over the bending or other movement of fulcrums 21 and 22, thus, improves the process of manufacturing packages using leadframe 10. Port 34 assists in controlling any moving that occurs at the proximal end of fulcrums 21 and 22. Ports 34 are opening through panel 11 that are formed at the proximal end or near the proximal end of fulcrums 21 and 22. Any number or all of fulcrums 21 and 23 may have ports 34. Ports 34 can have various shapes including a square, a rectangle, a circle, a triangle, or other shape that assists in controlling the movement. In the preferred embodiment, ports 34 are rectangles. Ports 34 typically have a length that is less than about eighty percent (80%) of the width of the respective fulcrum 21 or 22. The width of ports 34 generally is large enough to assist the movement and small enough to ensure that the molds can close and seal.

Figure 8:
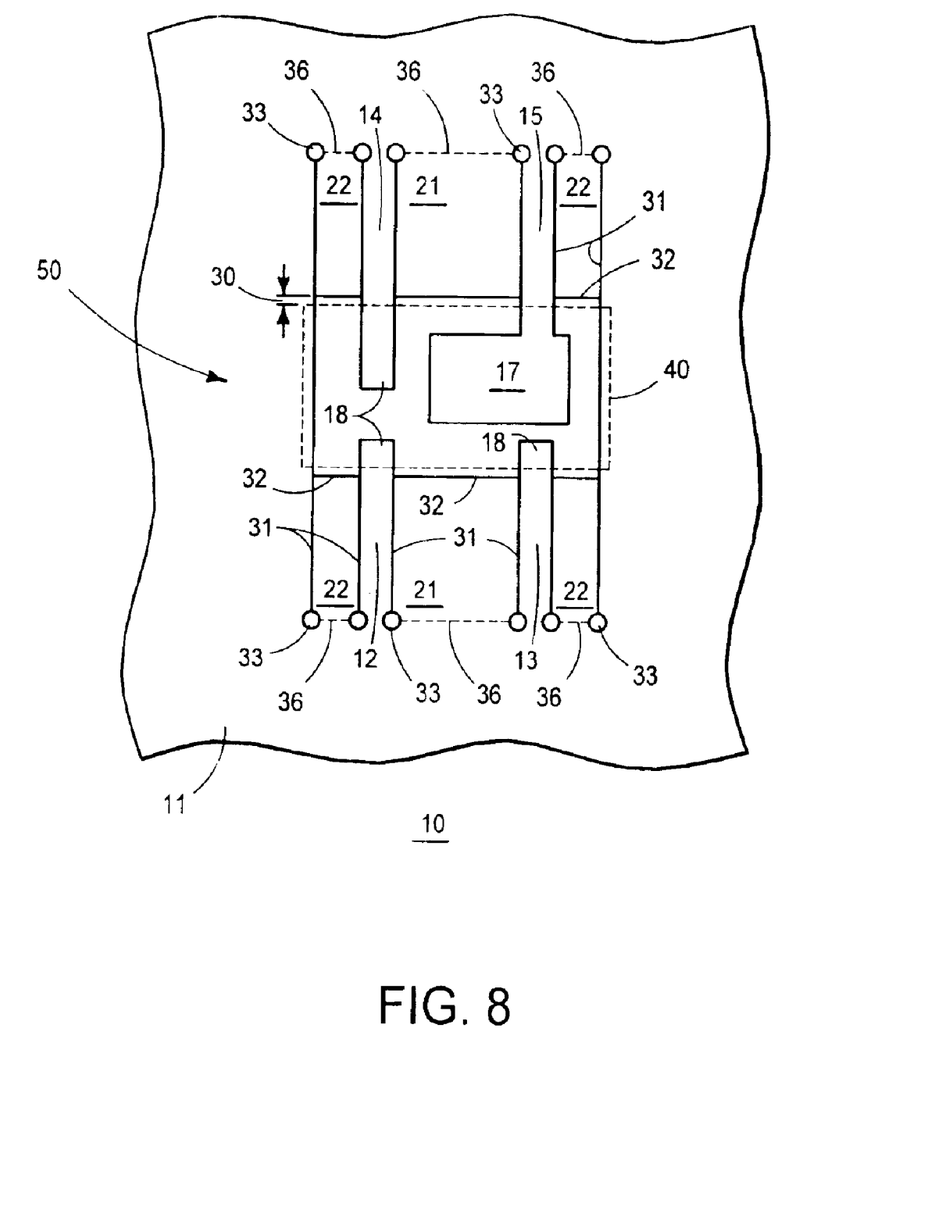
FIG. 8 illustrates an enlarged plan view of a third embodiment of a portion of the leadframe of FIG. 1 in accordance with the present invention.

FIG. 8 illustrates an enlarged plan view of a third embodiment of a portion of leadframe 10 of FIG. 1 illustrating an embodiment of a portion of a package site 50 that is an alternate embodiment of site 25 shown in FIG. 2. This explanation has references to FIG. 1, FIG. 2, and FIG. 3. Site 50 includes an optional relief opening 33. Relief openings 33 are holes that are formed through leadframe 10 at the proximal end of fulcrums 21 and 22 where sides 31 would intersect panel 11. Thus, openings 33 are positioned at the proximal end of the sides of leads 12–15. Typically, openings 33 have a width that is less than about one-half the width of the adjacent lead 12–15, and preferably is less than about one-fourth the width of the adjacent lead. Openings 33 can have various shapes such as a rectangle, a square, a circle, a triangle etc. In the preferred embodiment, openings 33 are circles. Relief openings 33 can be stamped out of panel 11 when the inner portion of section 40 is stamped out. Openings 33 provide some control over the movement of fulcrums 21 and 22, thus, improve the manufacturing process. Additionally, during any shearing operation used to form leads 12–15, openings 33 assist in ensuring that the sides of leads 12–15 and fulcrums 21 and 23 have uniform lengths. Openings 33 are optional and could be omitted in some embodiments.

Figure 9:
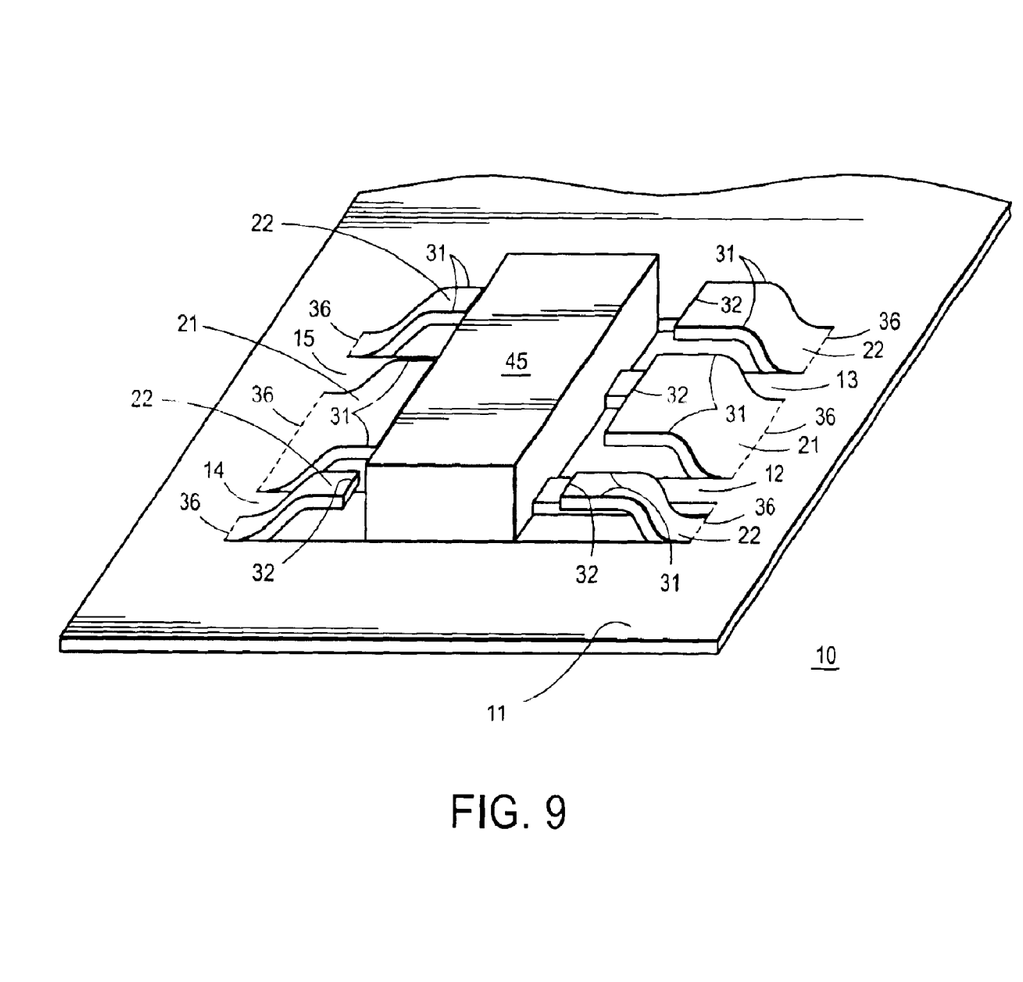
FIG. 9 illustrates an enlarged isometric view of the leadframe of FIG. 1 at a stage of manufacturing a semiconductor package in accordance with the present invention.

FIG. 9 illustrates an enlarged isometric view of leadframe 10 after several steps in the process of manufacturing a semiconductor package from leadframe 10. As is well know in the art, a semiconductor die typically is attached to flag 17 and wire bonded to leads 12, 13, and 14. Subsequently, leadframe 10 is placed into a mold and cavity section 40 is encapsulated. During the encapsulation process, the molds clamp down on leads 12–15 and on fulcrums 21 and 22. When the molds are closed on leadframe 10, a molding cavity within the molds typically corresponds to the shape and location of cavity section 40. A chase or runner from the mold may extend across one of fulcrums 21 or 22 into the mold cavity that overlies cavity section 40. During the molding operation, encapsulation material is forced into the mold cavity to encapsulate cavity section 40. During this encapsulation step, fulcrum 21 and 22 block the encapsulation material and restrict it from escaping the mold cavity. Thus, it is important that distance 30 be very small to prevent the encapsulating compound from escaping and touching leads 12–15. Also, the small size of spacing 35 substantially prevents the encapsulating compound from moving along the sides of leads 12–15, thus, preventing the encapsulating compound from attaching to leads 12–15. Because spacing 35 is very small, very little and preferably no encapsulating compound attaches to leads 12–15. Even with the small size of spacing 35, some amount of encapsulation the small size of spacing 35, some amount of encapsulation material may escape from the cavity and attach to the leads. Typically, the amount of encapsulating compound attached to leads 12, 13, 14, and 15 is less than about one-third of the amount left by prior art methods. The small size of spacing 35 also restricts the thickness of the encapsulating material that attaches to the sides of leads 12–15 to less than about fifty (50) microns. After the encapsulation operation, the molds are opened leaving a package body 45 encapsulating cavity section 40 and surrounding the distal ends of leads 12–15. In the preferred embodiment, body 45 is separated from fulcrums 21 and 22 by distance 30 (see FIG. 1).

Subsequent to the molding operation, fulcrums 21 and 22 are moved so that leads 12–15 can be plated. The movement carries sides 31 pass the sides of leads 12–15. Fulcrums 21 and 22 may be moved above or below panel 11, or may be moved both above and below. Distance 30 and spacing 35 are formed to be a size that facilitates such movement without damaging leads 12–15 or body 45. Fulcrums 21 and 22 generally are moved a distance that is sufficient to ensure they do not interfere with subsequent plating operations. For example, if the plating material is plated to a thickness of about ten (10) microns, fulcrums 21 and 22 should be moved at least ten (10) microns. In some cases fulcrums 21 and 22 may be moved up to ninety degrees (90°) or up to about one hundred eighty degrees (180°) to assist in plating the leads and in singulating the package from panel 11.

During the movement of fulcrums 21 and 22, any or all of optional features 36, ports 34, and openings 33 can assist in controlling the movement of fulcrums 21 and 22 to occur at the proximal end so that the majority of fulcrums 21 and 22 remain straight and move without damaging leads 12–15. In some cases, such as distance 30 being too large, moving fulcrums 21 and 23 may also assist in removing some of the encapsulation material or flashing that may be attached to leads 12–15.

After fulcrums 21 and 22 are moved, leadframe 10 is plated. Plating of the leads is well known in the art. Subsequently, the encapsulated package is singulated from panel 11 by cutting leads 12, 13, 14, and 15 to extend a desired length from body 45. This singulation operation typically leaves fulcrums 21 and 22 attached to panel 11. All surfaces of leads 12, 13, 14, and 15 are plated and no bare sections remain. It should also be noted, that some small portions of the encapsulation material may remain on the leads, however, this portion is very small and very thin, thus, any subsequent de-flashing operations can be done much more easily than prior de-flashing operations thereby preventing damage to the leads. For example, a lower pressure water jet may be used at a pressure that is about four or five time less than the pressure of prior high pressure water jet operations. If required, this de-flashing step typically is performed prior to plating. The lower pressure reduces damage to the package and to leads 12, 13, 14, and 15 thereby improving reliability and lowering the manufacturing costs.

Typically, leads 12, 13, 14, and 15 are less than about 0.2 milli-meters wide and less than about 0.1 milli-meters thick. However fulcrums 21 and 22 and spacing 35 can be used to improve leadframes, and packages using the leadframes, having leads that are thicker or wider or thinner or narrower.

Although body 45 is shown with leads 12–15 near the bottom of one side of body 45, those skilled in the art realize that leads 12–15 could be formed on all sides of body 45 and at various locations along the surface of each side.

Figure 10:
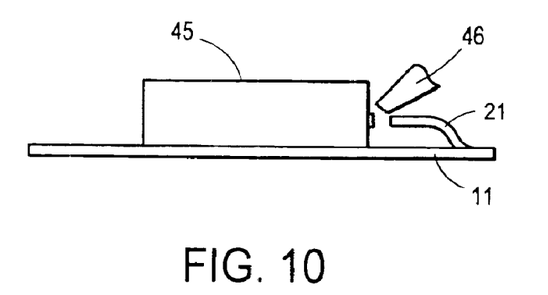
FIG. 10 illustrates an enlarged elevation view of a portion of the semiconductor package of FIG. 9 at a manufacturing stage in accordance with the present invention.

FIG. 10 illustrates an enlarged elevation view of a portion of the semiconductor package of FIG. 9 at a point during the manufacturing stage discussed in the description of FIG. 9. After the encapsulation operation, encapsulation material in the form of a mold gate 46 may be attached to body 45 and may be on one of fulcrums 21 or 22. Typically, a notch is formed in gate 46 near to the connection to body 45. This notch provides a weak spot that assists breaking gate 46 close to body 45. If such mold gate 46 is formed on one of fulcrums 21 and 22, the movement of fulcrums 21 and 22 may break mold gate 46 away from body 45 and away from the semiconductor package. Using fulcrums 21 and 22 to remove the mold gate reduces the amount of mechanical trimming that is required.

Figure 11:
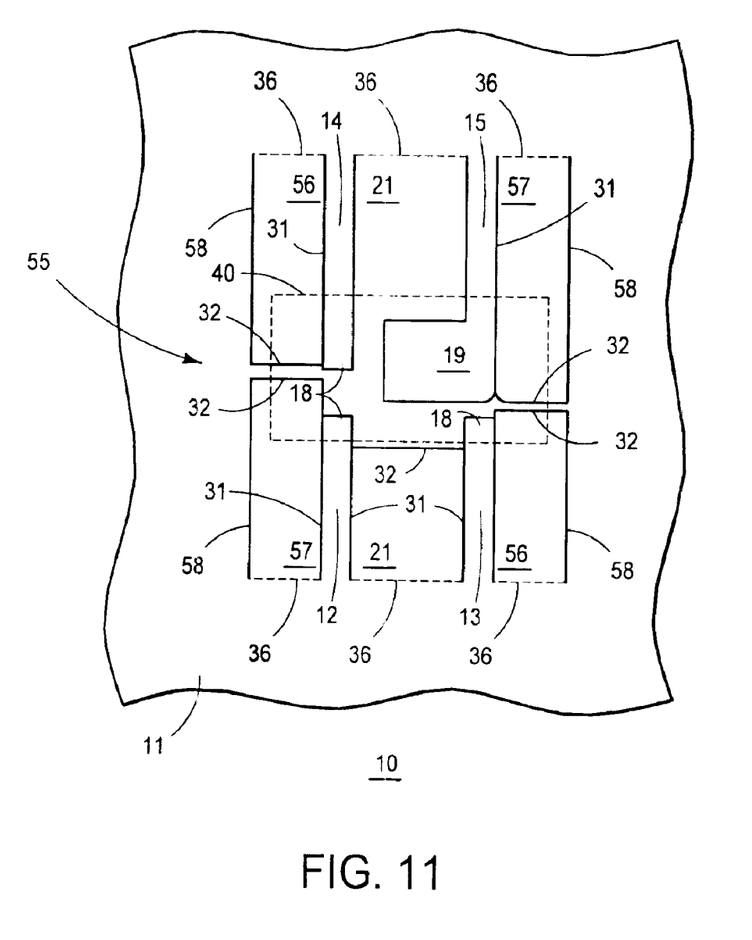
FIG. 11 illustrates an enlarged plan view of a fourth embodiment of a portion of the leadframe of FIG. 1 in accordance with the present invention.

FIG. 11 illustrates an enlarged plan view of a fourth embodiment of a portion of leadframe 10 of FIG. 1 illustrating an embodiment of a portion of a package site 55 that is another alternate embodiment of site 25 shown in FIG. 2. This explanation has references to FIG. 1. FIG. 2, and FIG. 3. Site 55 includes a plurality of blocking fulcrums including blocking fulcrums 56 and 57, that function similarly to fulcrums 21. However, fulcrums 56 and 57 are formed to have a length that positions ends 32 further within cavity section 40 than fulcrums 21. The length of fulcrums 56 and 57 allow fulcrums 56 and 57 to extend under the package body that will be formed over cavity section 40. When fulcrums 56 and 57 are excised, a stand-off will be formed on the bottom of the package body. In some embodiments ends 32 of fulcrums 56 could be less than one hundred microns from touching each other. Additionally, fulcrums 56 and 57 have a side 58 that extends past the end of cavity section 40. When the leadframe that has site 55 is used to form a semiconductor package, fulcrums 56 and 57 will be moved down from the plane of the bottom surface of panel 11. After the movement, each fulcrum 56 and 57 may leave a recess in the bottom surface of the package body where fulcrums 56 and 57 were previously located. Fulcrums 57 are shown to have different lengths than fulcrums 56 to illustrate two different combinations of lengths and positions of ends 32.

In view of all of the above, it is evident that a novel device and method is disclosed. Forming a blocking fulcrum adjacent to the sides of the leads facilitates using the blocking fulcrum to restrict mold material from reaching the leads. Making the spacing between the leads and the blocking fulcrums very small substantially prevents encapsulating compound from traveling along the sides of the leads and substantially prevents flashing on the leads. Although described with a transfer molding operation, the leadframe and method is also applicable to injection molding.

What is claimed is:

1. A method of forming a leadframe for a semiconductor device comprising:

forming a leadframe strip having a main panel and a plurality of cavity sections;

forming a plurality of leads extending from the main panel a first distance into a cavity section of the plurality of cavity sections;

forming three sides of each of the plurality of leads detached from the main panel and forming a proximal end of each of the plurality of leads attached to the main panel; and forming a blocking fulcrum extending from the main panel adjacent to a side of a lead of the plurality of leads and detached from the side of the lead of the plurality of leads and including terminating the blocking fulcrum no greater than a second distance from the cavity section.

2. The method of claim 1 wherein forming the blocking fulcrum extending from the main panel includes forming the blocking fulcrum to extend less than the first distance into the cavity section.

3. The method of claim 1 wherein forming three sides of each of the plurality of leads detached from the main panel includes cutting at least one side of at least one lead of the plurality of leads away from the blocking fulcrum.

4. The method of claim 3 further including realigning the blocking fulcrum and the least one lead of the plurality of leads subsequent to cutting the at least one side of at least one lead of the plurality of leads away from the blocking fulcrum.

5. The method of claim 1 further including forming a relief feature extending laterally across a portion of a width of the blocking fulcrum near the proximal end of the blocking fulcrum.

6. The method of claim 5 further including forming the relief feature having a shape that is one of a V shape or a U shape.

7. The method of claim 1 further including forming a relief port through the main panel near the proximal end of the blocking fulcrum including forming the relief port having a shape that is one of a circle, a square, a rectangle, or a triangle.

8. The method of claim 7 further including forming a relief opening through the main panel near the proximal end of the side of the lead of the plurality of leads.

9. The method of claim 1 wherein forming the blocking fulcrum extending from the main panel adjacent to the side of the lead of the plurality of leads and detached from the side of the lead of the plurality of leads and including terminating the blocking fulcrum no greater than the second distance from the cavity section includes forming the second distance no greater than 50 microns.

10. A method of forming a semiconductor package from a leadframe comprising:

providing the leadframe having leads and having a blocking fulcrum extending from a main panel of the leadframe toward a cavity section of the leadframe;

encapsulating the cavity section of the leadframe to form a body; and moving the blocking fulcrum away from a plane of the leads and away from the body.

11. The method of claim 10 further including plating the leads of the semiconductor package.

12. The method of claim 10 further including singulating the body and the leads from the main panel and the blocking fulcrum.

13. The method of claim 10 wherein moving the blocking fulcrum away from the plane of the leads includes bending the blocking fulcrum.

* * * * *